(12) United States Patent
Haga

(10) Patent No.: US 6,860,937 B1
(45) Date of Patent: Mar. 1, 2005

(54) METHOD FOR PREPARING ZINC OXIDE SEMI-CONDUCTOR MATERIAL

(75) Inventor: Koichi Haga, Miyagi (JP)

(73) Assignees: Tohoku Techno Arch Co., Ltd. (JP); Sumitomo Electric Industries, Ltd. (JP)

( * ) Notice: Subject to any disclaimer, the term of this patent is extended or adjusted under 35 U.S.C. 154(b) by 0 days.

(21) Appl. No.: 10/240,915

(22) PCT Filed: Mar. 27, 2000

(86) PCT No.: PCT/JP00/01876
§ 371 (c)(1),
(2), (4) Date: Sep. 25, 2002

(87) PCT Pub. No.: WO01/73160
PCT Pub. Date: Oct. 4, 2001

(51) Int. Cl.[7] ............................................. C30B 25/02
(52) U.S. Cl. ............................................. 117/2; 117/3
(58) Field of Search ................................. 117/2, 3

(56) References Cited

U.S. PATENT DOCUMENTS 4,623,426 A 11/1986 Peters .................... 156/614

FOREIGN PATENT DOCUMENTS

| JP | 57-123969 | 8/1982 | ........... C23C/11/08 |
| JP | 01-194208 | 8/1989 | ........... H01B/5/14 |
| JP | 11-074202 | 3/1999 | ......... H01L/21/205 |
| WO | WO 84/00178 | 1/1984 | ........... C30B/25/02 |

OTHER PUBLICATIONS

Sato, H., et al., "Transparent conducting ZnO thin films prepared on low temperature subtrates by chemical vapour deposition using $Zn(C_5H_7O_2)_2$", Thin Solid Films, No. 246, (1994), pp. 65–70.

Primary Examiner—Felisa Hiteshew
(74) Attorney, Agent, or Firm—Hayes Soloway P.C.

(57) ABSTRACT

A method for preparing zinc oxide semiconductor material in which an organometallic compound containing zinc as a metal composition is introduced into a reaction chamber and the zinc-containing organic compound is vaporized to effect a specific decomposition reaction on a substrate, thereby forming a zinc oxide semiconductor material on the substrate. The zinc-containing organic compound employed is one having a low reactivity with oxygen in a vapor phase under the temperature atmosphere in the reaction chamber.

12 Claims, 8 Drawing Sheets

METHOD FOR PREPARING ZINC OXIDE SEMI-CONDUCTOR MATERIAL

FIELD OF THE INVENTION

This invention relates to a method for preparing a zinc oxide semiconductor material comprising at least zinc and oxygen as constituent elements and capable of light emitting in the region of blue and near ultraviolet.

BACKGROUND OF THE INVENTION

Zinc oxide semiconductor materials comprising zinc and oxygen as constituent elements have recently attracted considerable attention since they can emit not only blue light but also near ultraviolet rays of 400 nanometers or less because of their wide band gap similarly to semiconductor materials such as gallium nitride and the like. Further, their applications to photodetector, piezoelectric device, transparent conductive electrode, active device and the like have also been expected without being limited to light emitting device.

To form such a zinc oxide semiconductor material, various methods such as MBE method using ultra-high vacuum, sputtering, vacuum evaporation, sol-gel process, MO-CVD method, and the like have been conventionally examined. With respect to the light emitting device, the MBE method using ultra-high vacuum is widely used from the viewpoint of crystalline.

However, the MBE method can provide a layer having crystallinity similar to single crystal, compared with other methods, but had problems that the necessity of forming an ultra-high vacuum of extremely high level results in the increase in size and cost of a device for proving such ultra-high vacuum, and the mass productivity is too poor to realize an inexpensive light emitting device because the production in ultra-high vacuum is indispensable.

Accordingly, this invention has been attained from the point of the above-mentioned problems, and has an object to provide a method for preparing a zinc oxide semiconductor material with the high crystal quality equal to or more that by the MBE method without requiring the ultra-high vacuum as in the MBE method.

DISCLOSURE OF THE INVENTION

To solve the above problems, a method for preparing zinc oxide semiconductor material according to this invention comprises introducing an organometallic source containing zinc as metal component into a reaction vessel and vaporizing the zinc-containing organic compound to effect a specific decomposition reaction on a substrate, thereby forming a zinc oxide semiconductor material on the substrate, characterized by employing, as the above zinc-containing organic compound, a zinc-containing organic compound which exhibits a low reactivity with oxygen in a vapor phase under the temperature atmosphere in the reaction chamber.

The conventional MO-CVD method comprising introducing organometallic source containing zinc as metal component into a reaction chamber and vaporizing the zinc-containing organic compound to effect a specific decomposition reaction on a substrate can be executed without requiring any ultra-high vacuum as in the MBE method, but diethyl zinc of a β-diketone zinc compound, which is frequently used as the zinc-containing organic compound therein, generates zinc oxide by a decomposition reaction even in a vapor phase near the substrate because of its explosively high reactivity with oxygen in the vapor phase, and the accumulation and crystallization of zinc oxide fine particles generated in the vapor phase on the substrate surface renders the resulting crystal polycrystalline to deteriorate the quality. Therefore, the reactivity with oxygen in the vapor phase of the zinc-containing organic compound with oxygen is reduced, whereby the generation of zinc oxide fine particles in the vapor phase can be suppressed, and the control of crystal growth on the substrate can be easily executed. Consequently, a zinc oxide semiconductor material of extremely high quality, compared with in the conventional MO-CVD method, having a crystal structure substantially equal to or more than the crystal structure by the MBE method can be easily and inexpensively obtained without forming the ultra-high vacuum as described above.

In the method for preparing zinc oxide semiconductor material of this invention, the zinc-containing organic compound is preferably preheated.

According to this, even if a zinc-containing organic material having low reactivity is used, the reactivity can be enhanced by preheating, and a zinc oxide semiconductor material having a high quality crystal structure can be efficiently formed.

In the method for preparing zinc oxide semiconductor material of this invention, the zinc-containing organic compound is preferably a hydrate containing a specific of water molecules.

According to this, zinc oxide having a high quality crystal structure, compared with non-hydrate, can be obtained with good reproducibility.

In the method for preparing zinc oxide semiconductor material of this invention, the zinc-containing organic compound is preferably zinc acetylacetonate ($Zn(acac)_2$; wherein ac represents acetylacetone).

According to this, not only the carbon impurities in the resulting zinc oxide semiconductor material can be reduced, but also the source material is easily and inexpensively available because the zinc acetylacetonate is industrially produced in large quantities, and the zinc oxide semiconductor material can be consequently, prepared at a low cost.

In the method for preparing zinc oxide semiconductor material of this invention, the hydrate of zinc acetylacetonate ($Zn(acac)_2$) is preferably a monohydrate.

According to this, the monohydrate is employed, whereby the stability of zinc acetylacetonate hydrate can be enhanced to improve the handling property.

In the method for preparing zinc oxide semiconductor material of this invention, the lattice constant of the substrate is preferably within ±20% of the lattice constant value of the zinc oxide to be formed.

According to this, defects by an abnormal growth of crystal can be reduced.

In the method for preparing zinc oxide semiconductor material of this invention, the substrate is preferably a monocrystal material having a crystal face allowing the crystal structure of the zinc oxide to be formed on the substrate with a-axis orientation of the wurtzite structure.

Whereas a c axis orientation in the wurtzite structure having a hexagonal crystal is apt to form nanocrystals by minimizing the hexagonal shape when the shape is even slightly deformed, the a-axial crystal orientation oriented to a-axis of the wurtzite structure has a rectangular shape capable of moderating a slight strain. Accordingly, a zinc oxide semiconductor material having a crystal structure oriented to the a-axis of the wurtzite structure, which hardly causes an abnormality in electric conduction by the bonding of impurities to the end of the nanocrystals formed as described above or the bonding of a conductive electron to a dangling uncoupled hand at the end surface, can be obtained.

In the method for preparing zinc oxide semiconductor material, the substrate is preferably a monocrystal sapphire having a (01$\bar{1}$2) orientation as the forming surface for the zinc oxide semiconductor material.

Since those having relatively large areas are inexpensively and easily available as the monocrystal sapphire having a (0112) orientation, the zinc oxide semiconductor material having a crystal structure oriented to a-axis of the wurtzite structure can be prepared at a low cost.

PREFERRED EMBODIMENT OF THE INVENTION

One preferred embodiment of this invention is described on the basis of the accompanying drawings.

Figure 1:
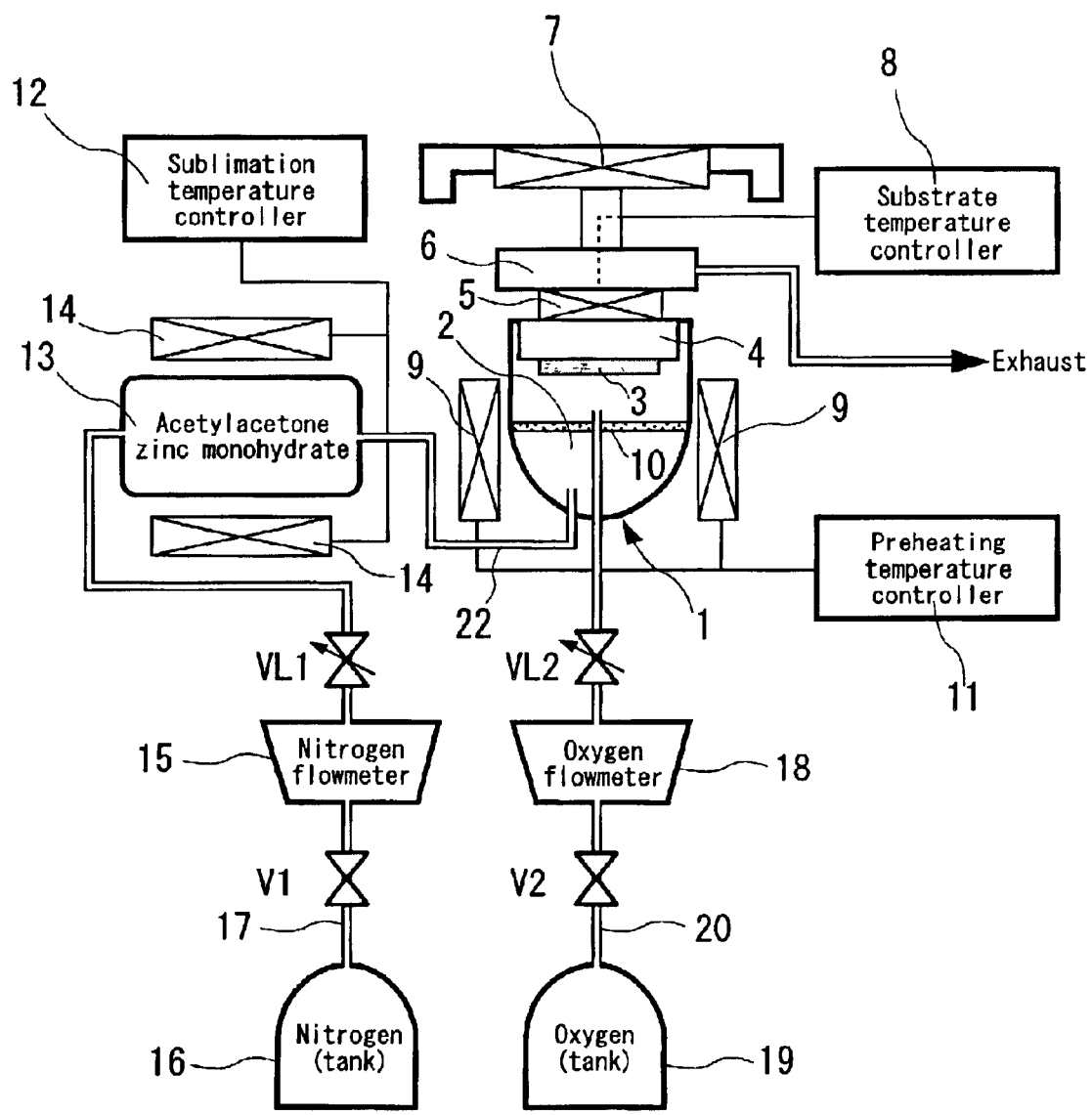
FIG. 1 is a view showing the structure of a MO-CVD apparatus to which a method for preparing zinc oxide semiconductor material of this invention is applied.

A metal-organic chemical vapor deposition (MO-CVD) apparatus for preparing a ZnO layer that is a zinc semiconductor material according to this invention is shown in FIG. 1. In this invention, since the atmospheric pressure MO-CVD method easily transferable to industrial mass production due to no use of ultra-high vacuum as in the above MBE method but also the execution of the vapor phase epitaxy at atmospheric pressure is applied, no large-sized vacuum equipment for evacuating a reaction chamber 1 that is a chamber for performing chemical vapor deposition (CVD) is connected to the reaction chamber 1 as shown in the drawing, and an exhausting fan 7 for properly exhausting the gas in the reaction chamber 1 to the outside is mounted on the upper position of the reaction chamber 1.

A glass cylinder 13 filled with powdery zinc acetylacetonate ($Zn(acac)_2$) monohydrate that is the source material of ZnO layer is connected to the reaction chamber 1 through a source material inlet tube 22, and the zinc acetylacetonate ($Zn(acac)_2$) monohydrate heated and sublimated by a sublimation heater 14 arranged so as to be heatable of the source material cylinder 13 is supplied through the lower side of the reaction chamber 1 for growing the layer by the nitrogen ($N_2$) carrier gas run out from a nitrogen tank 16 connected to the source material cylinder 13 through a nitrogen inlet tube 17 and controlled in flow rate by a nitrogen flowmeter 15 and a flow variable valve VL1. The temperature of the source material cylinder 13 by the sublimation heater 14 is controlled to a preset prescribed temperature by a sublimation temperature controller.

An oxygen tank 19 that is the supplying source of oxygen for the ZnO layer to be formed is connected to the reaction chamber 1 through an oxygen inlet tube 20 separately provided from the raw material inlet tube 22 in order to avoid the gas phase reaction of oxygen gas ($O_2$) with the zinc acetylacetonate ($Zn(acac)_2$) monohydrate, and an oxygen flowmeter 18 and a flow variable valve VL2 are provided in the inflow route of the oxygen, so that the oxygen ($O_2$) gas controlled in flow rate is discharged through a preheating promoting porous metal plate 10 provided adjacently to a substrate 3 in the reaction chamber 1, and the oxygen ($O_2$) gas is supplied separately from the zinc acetylacetonate of source material up to just the front of the substrate.

A preheating heater 9 is provided on the circumference of the lower space 2 of the reaction chamber 1 for discharging the zinc acetylacetonate monohydrate supplied into the reaction chamber 1 together with the nitrogen ($N_2$) carrier gas to preheat the vapor of zinc acetylacetonate monohydrate introduced into the reaction chamber 1 in the lower space 2 before it reaches the substrate 3 on a substrate holder 4 provided in the upper position within the reaction chamber 1. The preheating temperature is controlled to a prescribed temperature by a preheating temperature controller 11 connected to the preheating heater 9.

On the reverse (upper) side of the substrate holder 4 provided in the upper position within the reaction chamber 1, a substrate heating heater 5 for heating the substrate 3 is provided on a sample holder 6 (on the lower surface) to control the temperature of the substrate 3 heated by the substrate heating heater 5 to a prescribed temperature by a substrate temperature controller 8.

The zinc acetylacetonate monohydrate used as the source material in this invention is a white powder at room temperature, and the powder is filled in source cylinder 13. However, this invention is never limited thereby, and the zinc acetylacetonate monohydrate may be pelletized in a prescribed size and filled in the cylinder 13 from the point of improvement in handling property when mass productivity is taken into consideration. The heating of the filled zinc acetylacetonate monohydrate may be carried out by introducing the nitrogen ($N_2$) carrier gas heated to a prescribed temperature into the cylinder 13 to obtain sublimated zinc acetylacetonate vapor.

Figure 3:
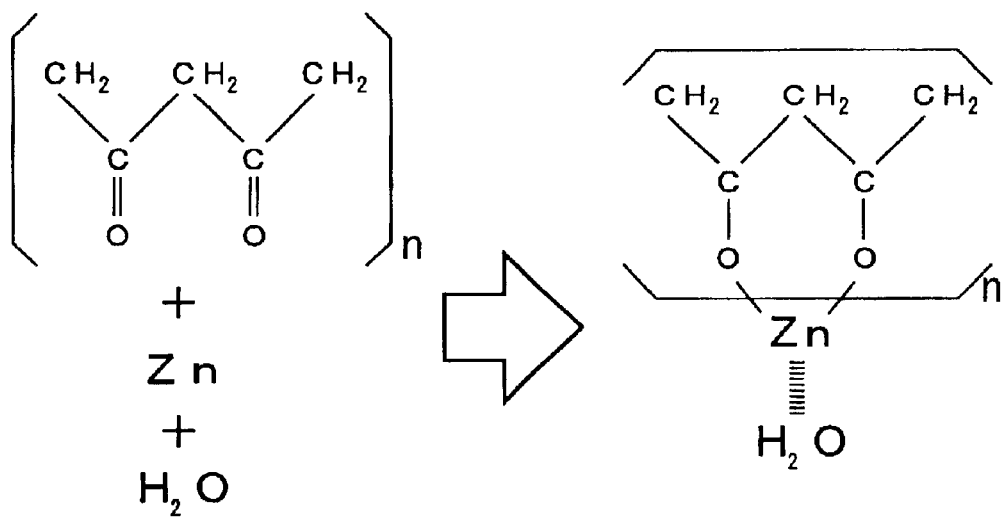
FIG. 3 is a view showing the molecular structure of zinc acetylacetonate monohydrate that is a zinc-containing organic compound used in this invention.

The zinc acetylacetonate monohydrate which is the supplying source of zinc has a structure as shown in FIG. 3, wherein a water molecule is coordinate-bonded to zinc atom with oxygen as a ligand. As the zinc acetylacetonate, those with purity of 99.8–99.99% are generally commercially available as reagents, wherein a hydrate and a non-hydrate are included. However, when such a reagent including the hydrate and non-hydrate is used as source as it is, the reproducibility of crystallinity is inferior in the non-hydrate, and the hydrate exhibits more satisfactory reproducibility. Accordingly, the simple substance use of only hydrate is preferred for a stable production.

The cause of this difference in reproducibility is attributable to that the oxygen atom of the water molecule is coordinate-bonded to the zinc atom itself in the hydrate, and the oxygen atom in the water molecule is used as the oxygen atom used for a part of the generation of the ZnO layer in addition to the oxygen in air to provide the stable reproducibility of crystal growth. The zinc acetylacetonate includes several kinds of hydrates with a plural coordination of water molecules coordinated thereto, and the monohydrate is preferable among them from the point of stability of hydrate in addition to the ratio of oxygen atom in water molecule to zinc atom. However, this invention is never limited by this.

The use of zinc acetylacetonate as the zinc-containing organic compound as in this embodiment is preferable because the zinc acetylacetonate itself is industrially mass produced and inexpensively and easily available as described later. However, this invention is never limited thereby and, for example, zinc dipivaloylmethanate (DPM) and other zinc-containing organic compounds which exhibit relatively low reactivity with oxygen may be used as the zinc-containing organic compound.

Needless to say, it is optional to add a specified quantity of an acetylacetone metal or dipivaloylmethanate (DPM) metal such as Li and Cu of the group I compounds, B, Ga, In, Al or the like of the group III compounds, and the like as the supplying source of a doping element for forming P-type and N-type of semiconductor.

Whereas diethyl zinc used in conventional metal-organic chemical vapor deposition (MO-CVD) is explosively reacted with the oxygen in air and burnt at room temperature, this zinc acetylacetonate as the supplying source of zinc is relatively stable from room temperature to the temperature for plastic synthesis as is apparent, for example, from that it is industrially used in large quantities as a plastic stabilizer because of the property of zinc of absorbing chlorine radicals generated in the plastic synthesis of vinyl chloride or the like, and the reactivity with oxygen is remarkably low, compared with the diethyl zinc. This can be understood from the differential thermal analytic (DTA) and thermogravimetric (TG) measurement results of zinc acetylacetone and zinc acetylacetonate monohydrate shown in FIG. 4, and also from the remarkably smaller quantity of carbon atom left in the resulting crystal in the zinc acetylacetonate. The differential thermal analysis comprises measuring an endothermic or exothermic reaction in the change of the structure of a material. The thermogravimetry comprises measuring the weight change in the sublimation or evaporation of the material. The weight change shows a different value in conformation to heating speed, but the endothermic or exothermic reaction shows a value natural to the material. The measurement condition for DTA and TG is set to an atmospheric environment with a temperature rise speed of 10° C./min and $N_2$ gas flow rate of 200 cc/min.

Figure 4:
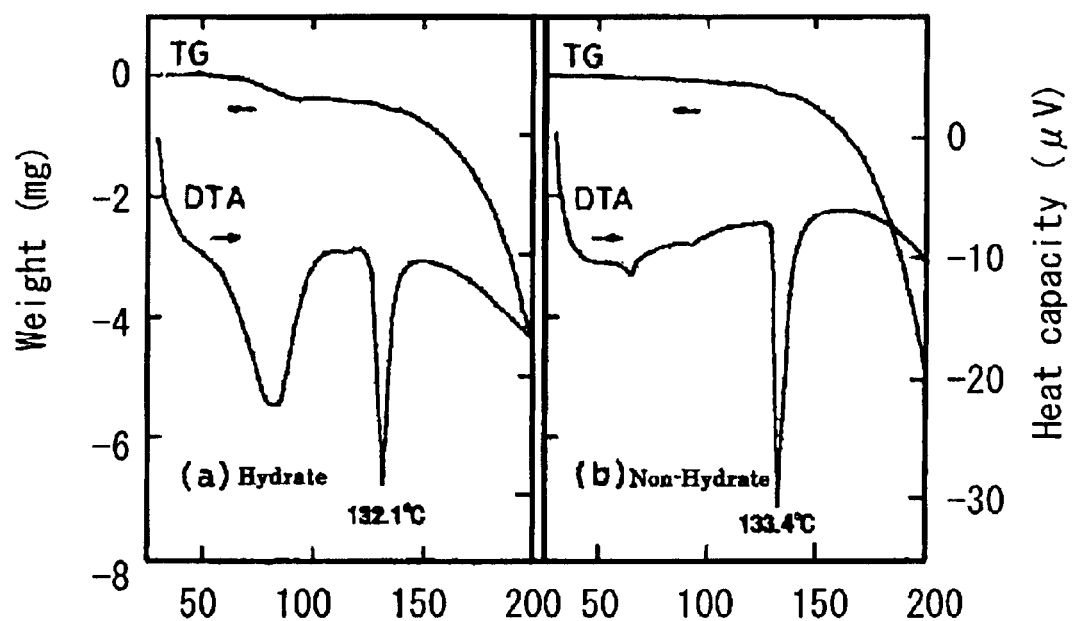
FIG. 4 is a graph showing the differential thermal analytic (DTA) and thermogravimetric (TG) measurement results of zinc acetylacetonate and its monohydrate thereof which are zinc-containing organic compounds used in this invention.

In the TG curve of the monohydrate in FIG. 4(*a*), the weight starts to decrease little by little from at about 50° C., and a large endothermic reaction is observed in the DTA curve. This is attributable to that the water molecule coordinate-bonded to the zinc atom of the zinc acetylacetonate monohydrate absorbs the vaporization heat for evaporation according to temperature rise, and its vaporization quantity is gradually increased. When the material is further heated, the weight reduction sharply increases from at about the melting peak (132.1° C.) of the DTA curve. The TG curve in FIG. 4(*b*) of the zinc acetylacetonate that is a non-hydrate uniformly decreases from at about 60° C., and sharply decreases from at about the melting peak (133.4° C.) slightly higher than that of the hydrate. The melting point is also important for the formation of a ZnO thin film of good quality, and preferably set to the range of 132° C. to 135° C.

The zinc acetylacetonate and zinc acetylacetonate monohydrate are relatively low in reactivity with oxygen gas, and require the use of pure water as the supplying source of oxygen. However, it is known that the water condensed in the low-temperature area of a pipe or apparatus is re-evaporated when the ambient temperature rises in the use of pure water as a source material in the atmospheric pressure CVD process, making it difficult to obtain the reproducibility of layer composition. This is very likely to obstruct the industrial production process. Therefore, in the above device, the zinc acetylacetonate is preheated in the lower space 2 of the reaction chamber 1 as described above for the purpose of compensating the low reactivity of the zinc acetylacetonate with oxygen gas, whereby the reactivity with oxygen on the substrate 3 is promoted.

The preheating promoting porous metal plate effectively functions to decompose the zinc acetylacetonate that is an organic metal. The zinc acetylacetonate is carried by $N_2$ carrier gas of about 200–1000 cc/min. Although the glass tube wall is warmed by use of a heater wound around the preheating area, the staying time of the zinc acetylacetonate material in the preheating area is shortened by the relatively high flow velocity of the carrier gas, and the heating of the material sufficient for promotion of decomposition cannot be performed. The preheating promoting porous metal plate has a double effect of the increase in staying time and the promotion of decomposition by the direct contact of the zinc acetylacetonate to the preheating promoting porous metal plate. The decomposition of the zinc acetylacetonate can be controlled by these effects.

The preheating promoting porous metal plate is manufactured by boring holes of about 0.1–5 mm in a metal plate of stainless steel or the like. To reduce the temperature drop of the substrate surface by the high-speed carrier gas brown out from the holes of the metal plate, a large number of metal plates may be stacked while shifting the positions of holes and providing a clearance.

The edge of the metal plate is desirably in contact with the glass tube wall of the reaction chamber to prevent the zinc acetylacetonate material not promoted in decomposition from flowing out through the clearance between the reaction chamber and the metal plate.

The material for the metal plate is required to be a metallic material resistant to a temperature of 200° C. or higher. The use of the metal plate is general, but a material such as ceramic, mesh, glass wool or the like may be substituted therefor.

In the formation of the zinc oxide layer, the temperature of the preheating promoting porous metal plate is preferably set to the range from the sublimation temperature of zinc acetylacetonate to the vaporization temperature thereof. The temperature range is desirably within 100–400° C., more preferably 125–250° C.

Figure 2:
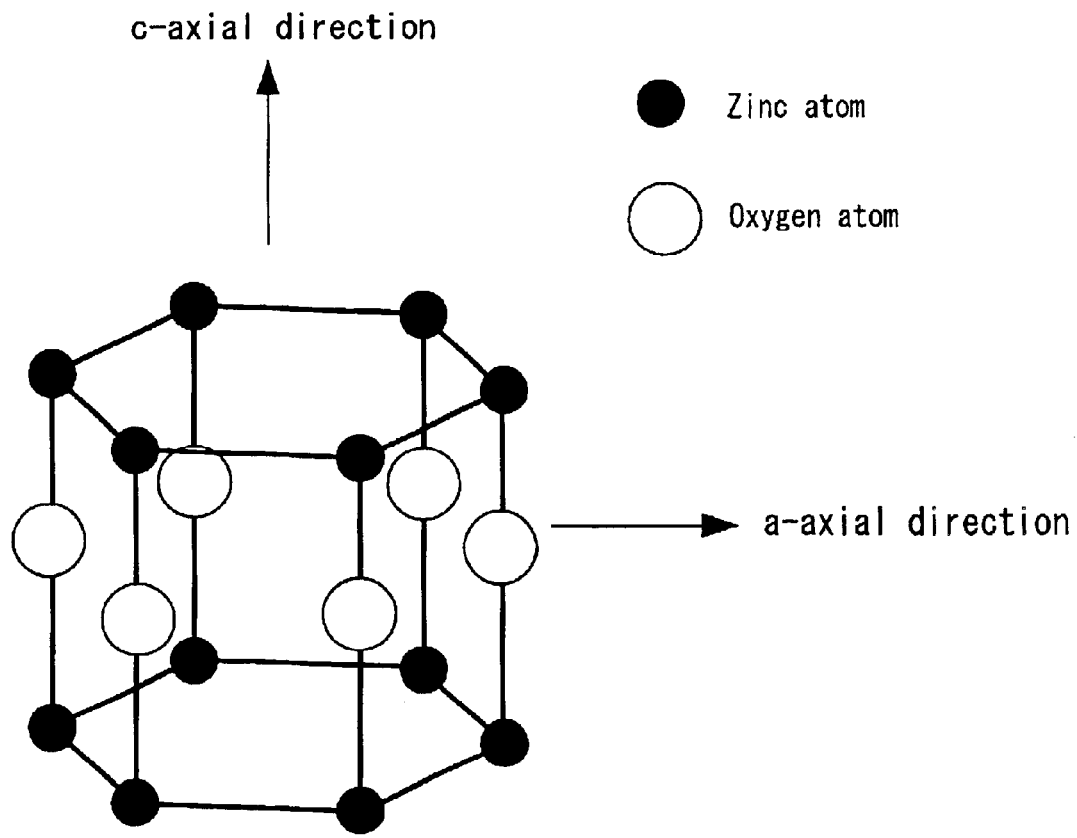
FIG. 2 is a model view showing the crystal structure of a zinc oxide.

In the ZnO layer formed on the substrate 3 in the above device by use of the zinc acetylacetonate monohydrate, as shown in FIG. 2, (002) plane oriented to c-axis of the wurtzite structure and (110) plane and (100) plane oriented to a-axis thereof are used as the crystal orientation plane in the use as light emitting device. Whereas the c-axial plane is apt cause an abnormality in crystal growth because of the hexagonal crystal orientation, so that the crystal size is apt to be fined to generate nanocrystals, the a-axial planes (110) and (100) hardly cause the abnormal growth because of the rectangular crystal plane and the inclusion of Zn atoms and O atoms on the crystal plane, so that a crystal of high quality can be obtained.

In this embodiment, a monocrystal sapphire substrate that is a heteroepitaxial substrate is used as the substrate 3. The sapphire substrate has a corundum structure, and a c-plane substrate having (002) plane and a R-plane substrate obtained by obliquely cutting the crystal plane are prepared. The R-plane substrate is not only mass produced as a substrate (SOS substrate) for a silicon epitaxial growth layer, but also has the merit that a relatively large substrate is easily available because the crystal is obliquely cut, and it is suitable for the substrate 3. In this invention, the ZnO layer having (110) orientation is grown on the R-plane substrate without free from abnormal growth. Further, this layer is excellent in crystallinity and satisfactory in doping characteristic, compared with a sample with (002) c-axial orientation plane.

The substrate 3 to be heteroepitaxially grown is not limited by the sapphire substrate, but includes other substrates such as Si, SiC, Ge, Ga, GaN, GaAs, ZnS, ZnSe, diamond, MgO, MgAlO$_3$, ZrO$_2$, CuAlO$_3$, ZnMgO$_3$, and the like. However, the lattice constant value of the substrate material is required to be within 20% of the lattice constant of the ZnO layer. When the lattice constant difference exceeds this, a defect by abnormal growth occurs in the developed ZnO layer. When the light emitting device to be formed requires the multifunctionalization of a drive circuit or the like, a lattice mismatch exceeding 20% might occur. In this case, an intermediate layer may be provided to adjust the lattice mismatch to 20% or less in the interface with the ZnO layer.

When the substrate material is a different kind material such as sapphire substrate or the like as described above, in addition to the lattice mismatch, a mechanical stress is necessarily generated in the interface between the substrate material and the ZnO layer as light emitting device. Accordingly, the instantaneous switching of composition in the interface between the substrate material and the ZnO layer is not preferred because chemical and mechanical stresses are increased. Thus, the constituent element of the substrate material is preferably diffused to the ZnO layer side in the interface between the ZnO layer that is a light emitting material and the substrate material, and the quantity of diffusion is preferably set so that at least one of the constituent elements of the substrate material is included in the range of 0.00–1 at. % from the initial growth stage of the light emitting device to the position of 50 Å. When the element is included more than this, the constituent element of the substrate material seriously affects as impurities in the ZnO layer to disturb the growth of the monocrystal layer. The addition quantity thereof is adjusted, for example, by changing the substrate temperature in the initial growth stage, adding only a trace amount of the constituent element of the substrate as impurities in the initial growth stage of the ZnO layer, or the like.

The thus-formed ZnO layer is usable as light emitting device, for example, in a luminescence device, LED device, laser device or the like.

Figure 5:
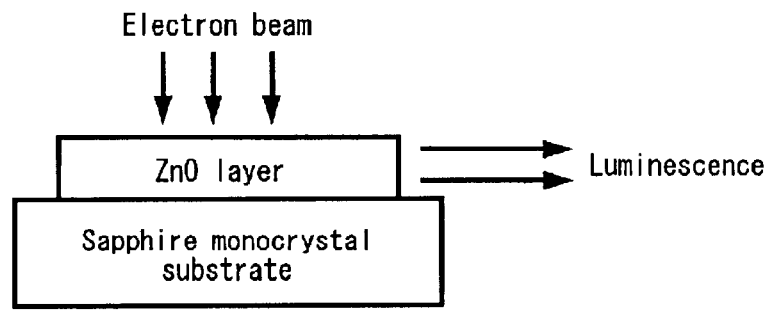
FIG. 5 is a view showing an applied form example of a zinc oxide layer obtained according to the method for preparing zinc oxide semiconductor material of this invention to a luminescence device.
Figure 6:
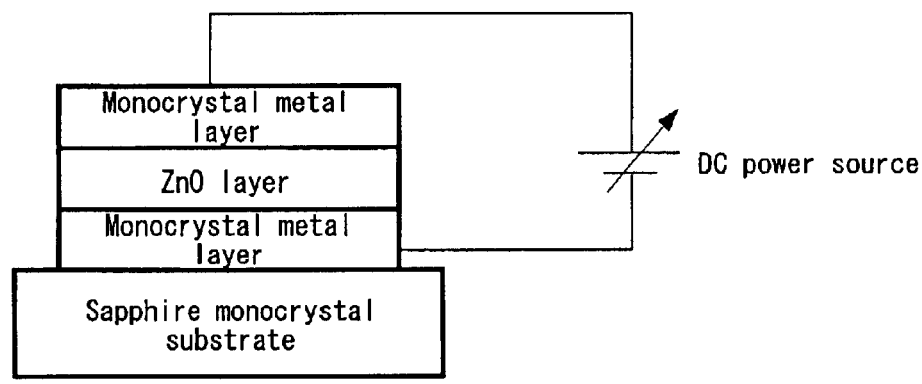
FIG. 6 is a view showing an applied form example of a zinc oxide layer obtained according to the method for preparing zinc oxide semiconductor material of this invention to a DC EL device.
Figure 7:
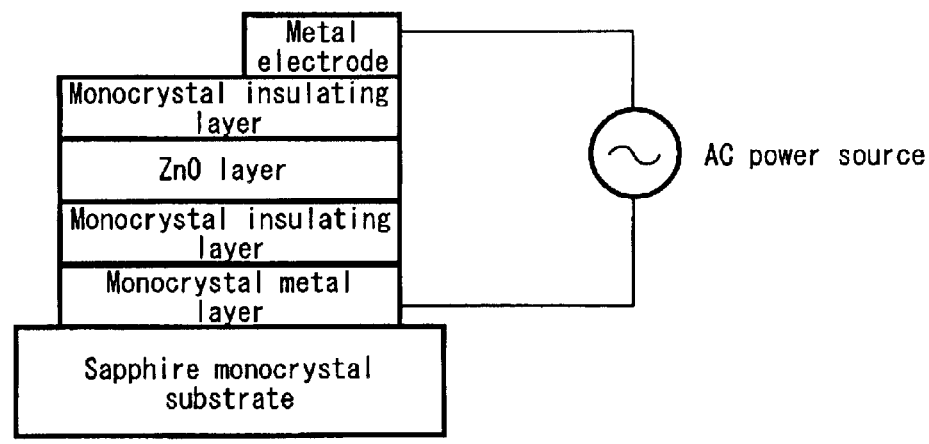
FIG. 7 is a view showing an applied form example of a zinc oxide layer obtained according to the method for preparing zinc oxide semiconductor material of this invention to an AC-exchange impression luminescence device.

The luminescence devices using ZnO layer include an element performing an external excitation with an external light source such as later, electron beam or the like and an EL device performing an internal excitation by application of DC or AC. The structure of the device performing external excitation by laser or electron beam or the like is shown in FIG. 5. A band edge emission is caused in ultraviolet region by the external excitation. FIG. 6 shows an example of a DC EL device. In the DC device, an electrode is used as a Schottky junction. As the material of the Schottky electrode, Au, Pt, Pb and the like having a large work function is used. In the AC exchange impression device, as shown in FIG. 7, an insulating material is put between ZnO and an electrode. Examples of the insulating material include SiO$_2$, Si$_3$N$_4$, MgO, and MgAlO$_3$.

Figure 8:
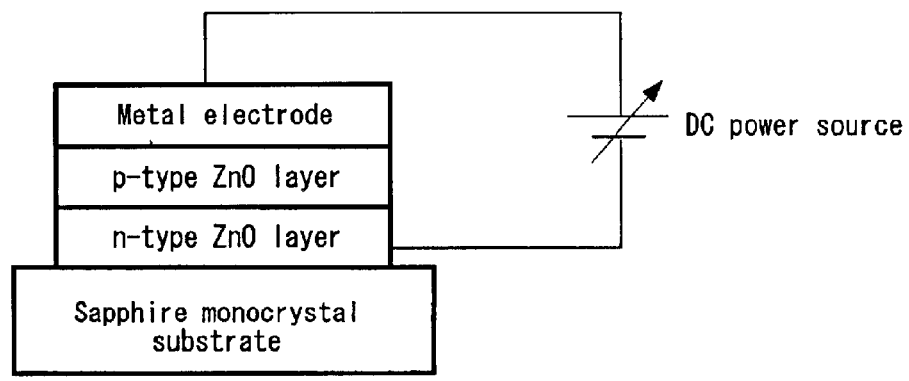
FIG. 8 is a view showing an applied form example of an LED device having a pn-junction formed only by ZnO layers obtained according to the method for preparing zinc oxide semiconductor material of this invention.
Figure 9:
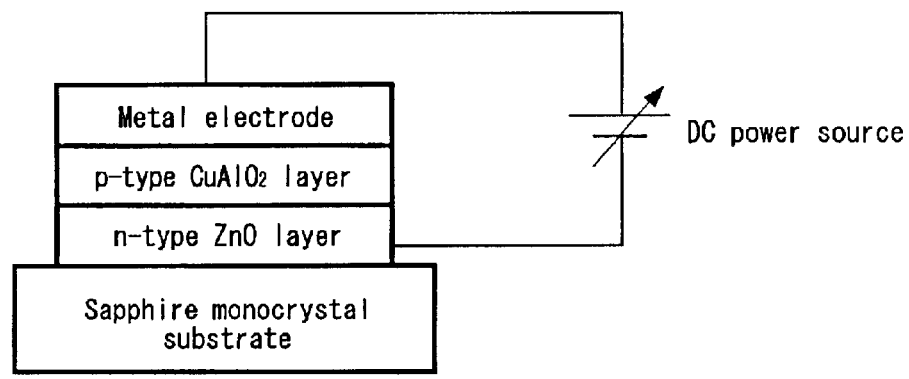
FIG. 9 is a view showing an application example to an LED device using the ZnO layer obtained according to the method for preparing zinc oxide semiconductor material of this invention and $CuAlO_2$ or NiO naturally having p-type conduction.

The LED devices include a one having a pn-junction only by ZnO as shown in FIG. 8, and a one comprising CuAlO$_2$ or NiO or the like naturally having p-type conduction formed in the p-type layer as shown in FIG. 9.

Figure 10:
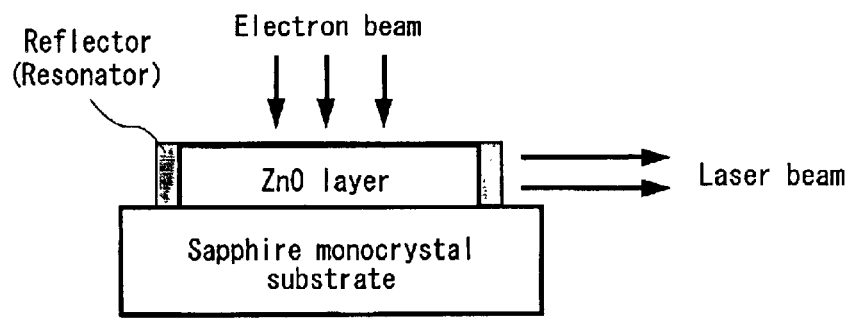
FIG. 10 is a view showing an application example of a ZnO layer obtained according to the method for preparing zinc oxide semiconductor material of this invention to an optical pumping type laser device.
Figure 11:
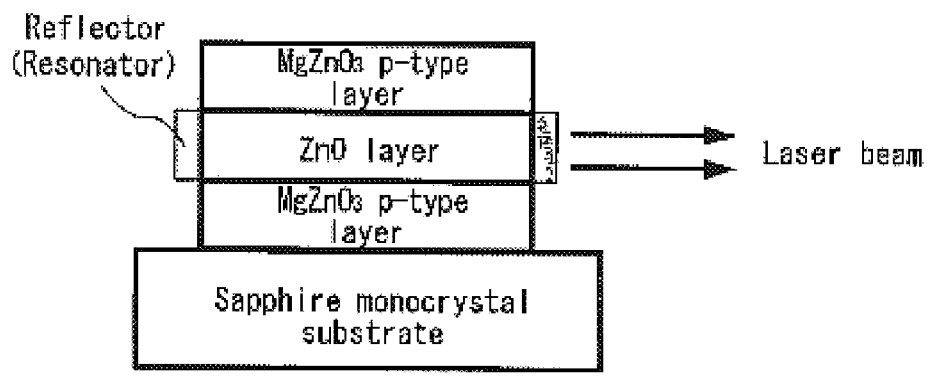
FIG. 11 is a view showing an application example of a ZnO layer obtained according to the method for preparing zinc oxide semiconductor material of this invention to a semiconductor laser device.

The laser devices include an external excitation type shown in FIG. 10 and a semiconductor laser device. The structure of external excitation device has a reflector formed on a luminescence device. The dielectric mirror which accumulates a metallic material and dielectric substances such as Al and Au is used as a stuff of the reflection mirror. The semiconductor laser preferably forms a double hetero structure as shown in FIG. 11 from the point of emission efficiency. The cladding layer of the double hetero structure includes CuAl$_2$, MgZnO$_3$ and the like which have a wider band gap than ZnO. As the material for the reflector, the same ones as used for the external excitation laser are applicable.

The photodetector is finally integrated to the substrate having the light emitting device formed thereon, and the output of this light photodetector is fed back to control the input current of the light emitting device, whereby the output of the light emitting device can be limited. For this photodetector, a ZnO layer formed of the same material as the light emitting device can be used. An optical modulator for controlling the light output of the light emitting device can be also formed on the same substrate. Since the ZnO layer functions as a piezoelectric element, a surface acoustic wave (SAW) device can be formed. This device is located on the output side of the light emitting device, whereby the emission output can be modulated, or the emission output can be stabilized. Further, it is formed in a resonator within the reflector, whereby a Q-switch type pulse laser can be also formed.

EXAMPLE

This example is an application example of a ZnO layer to an external excitation luminescence device. For the substrate 3 for forming the ZnO layer, a monocrystal sapphire R-plane was used. Zinc acetylacetonate [$Zn(C_5H_7O_2)_2$] of purity 99.99% was used as a zinc source organic compound, and $O_2$ gas of purity 99.99% was used as an oxygen source. The ZnO layer growth condition was set to a substrate temperature of 475° C., an oxygen flow rate of 400 cc/min, and a nitrogen flow rate as carrier gas of 200 cc/min. The sublimation and preheating were carried out at 124° C. as the set temperature of the sublimation temperature controller 12 and at 160° C. as the set temperature of the preheating temperature controller 11, respectively. The temperatures of the sublimation and preheating may be properly selected on the basis of the kind or reactivity of the zinc-containing organic compound to be used.

Figure 12:
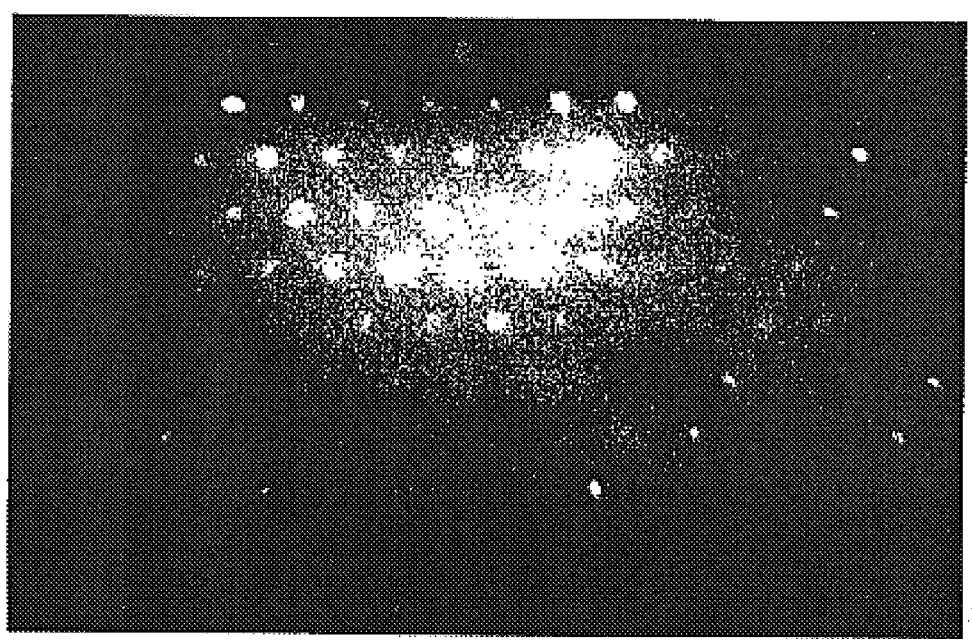
FIG. 12 is a view showing the reflection electron beam diffraction photograph of a ZnO layer obtained according to the method for preparing zinc oxide semiconductor material of this invention.
Figure 13:
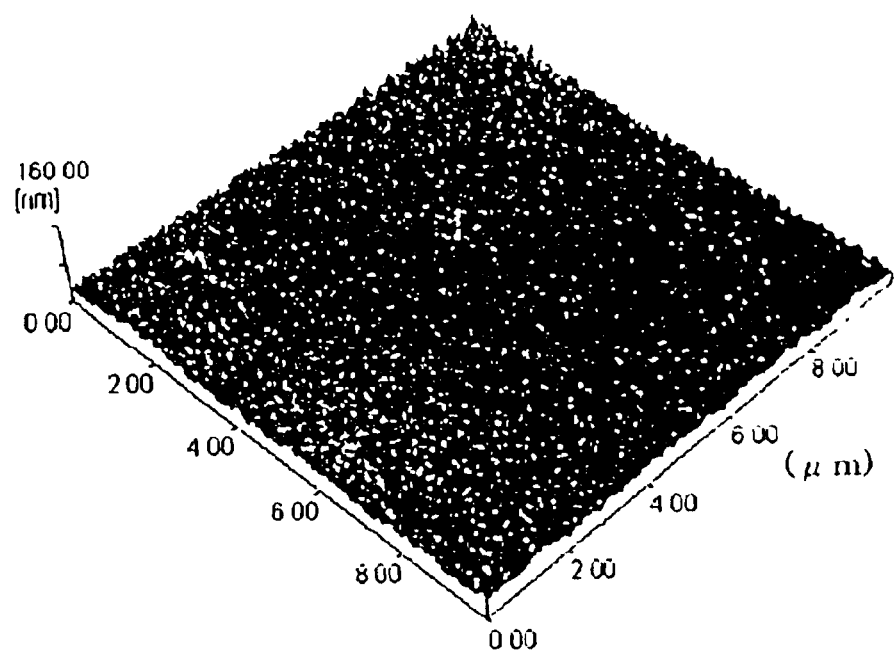
FIG. 13 is a view showing the surface image by an atomic force microscope (AFM) of a ZnO layer obtained according to the method for preparing zinc oxide semiconductor material of this invention.

FIG. 12 shows a diffraction pattern obtained by use of a reflection electron beam diffraction instrument. As is apparent from the result, a clear spot and Kikuchi line showing a monocrystal were observed. The appearance of the Kikuchi line shows that the crystalline structure is extremely excellent.

Figure 14:
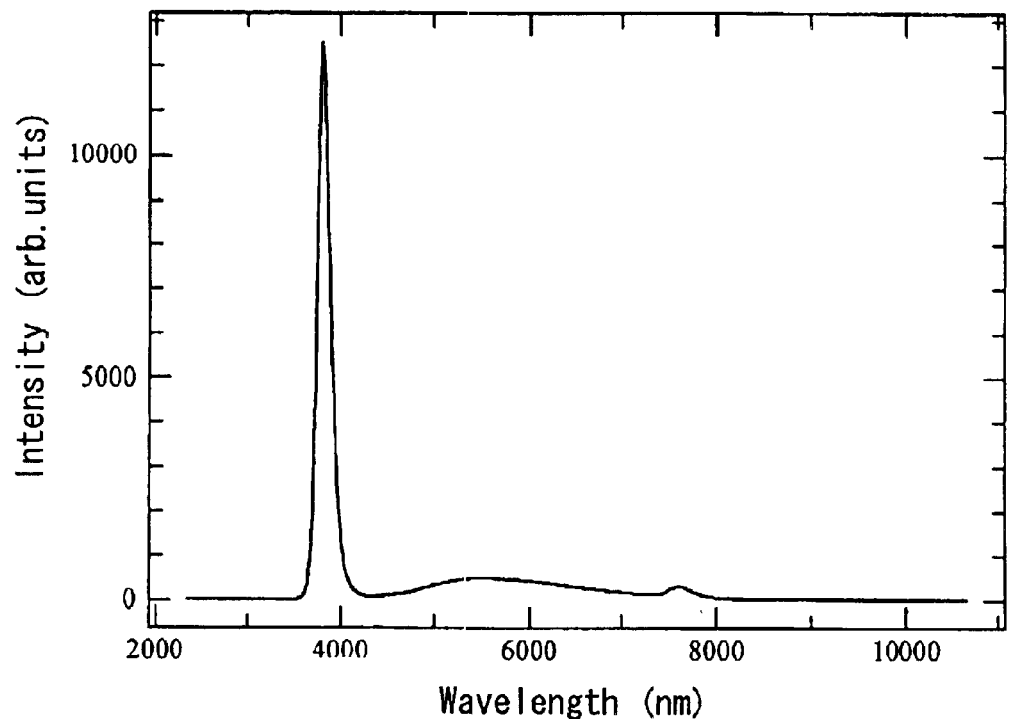
FIG. 14 is a graph showing the emission spectrum by external excitation of electron beam irradiation of a ZnO layer obtained according to the method for preparing zinc oxide semiconductor material of this invention.
Figure 15:
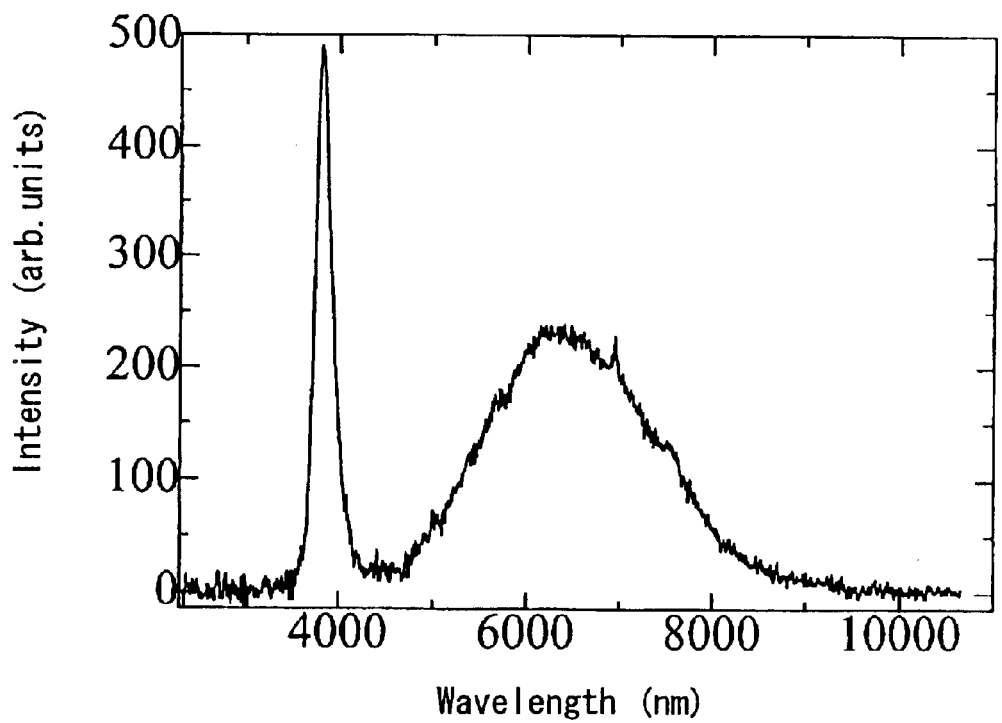
FIG. 15 is a graph showing the emission spectrum by external excitation of electron beam irradiation of a ZnO layer obtained according to a conventional method for preparing zinc oxide semiconductor material.

FIG. 14 shows the emission spectrum in the external excitation by electron beam irradiation. A near ultraviolet emission peak with high intensity which seems to be a band edge emission was observed in 380 nm. The emission in a visible region by impurities or lattice defect as shown in FIG. 15, which was reported in a ZnO layer by the conventional MO-CVD method using highly reactive diethyl zinc, was hardly observed.

From the above results, it can be concluded that an external excitation type luminescence device that is one of light emitting devices can be obtained. Needless to say, a laser light emitting device can be obtained by forming a reflector on this element to form a resonator.

The preferred embodiment of this invention is described in Example in reference to the drawings. This invention is never limited by such an embodiment, and various changes or additions within the scope never departing from the purport of this invention can be involved in this invention.

For example, although a general electric heater is used as the preheating heater 9 in the above preheating, an electromagnetic wave generator such as magnetron or the like may be used as the preheating means to output electromagnetic waves satisfactorily absorbable by a water molecule, particularly, electromagnetic waves of 2.4 GHz band to execute the heating, since there is the possibility that a crystal of high quality with good reproducibility can be obtained by efficiently exciting the oxygen atom directly coordinated to the zinc atom, particularly the oxygen atom in the water molecule in the use of the zinc acetylacetonate monohydrate as the zinc-containing organic compound. Further, it is also included in the preheating that the reactivity is enhanced by directly exciting the oxygen atom in the water molecule or acetone functional group by laser beam irradiation or the like.

In the above device, although oxygen is supplied to the reaction chamber 1 from the outside, the supply of oxygen may be properly stopped when the oxygen in the water molecule or the oxygen in the acetylacetone molecule can be used as reactive oxygen.

The MO-CVD is carried out at atmospheric pressure in the above. However, this invention is never limited thereby, and the MO-CVD may be carried out in a proper low pressure. To improve the growth rate, plasma or the like may be introduced to accelerate the decomposition of the zinc-containing organic compound.

Description of Reference Marks
1. Reaction chamber (Reactor)
2. Lower space (Preheating area)
3. Substrate
4. Substrate holder
5. Substrate heater
6. Sample holder
7. Exhausting fan
8. Substrate temperature controller
9. Preheating heater
10. Preheating promoting porous metal plate
11. Preheating temperature controller
12. Sublimation temperature controller
13. Source material cylinder
14. Sublimation heater
15. Nitrogen flowmeter
16. Nitrogen tank
17. Nitrogen inlet tube
18. Oxygen flowmeter
19. Oxygen tank
20. Oxygen inlet tube
22. Source material inlet pipe
VL 1. Flow rate controller
VL 2. Flow rate controller

What is claimed is:

1. A method for preparing a zinc oxide semiconductor material comprising introducing an organometallic compound containing zinc as a metal component into a reaction chamber and vaporizing a zinc-containing organic compound to effect a specific decomposition reaction on a substrate, thereby forming a zinc oxide semiconductor material on the substrate, which comprises using, as the zinc-containing organic compound, a zinc-containing hydrate containing a specific ratio of water molecules having a low reactivity with oxygen in a vapor phase under the temperature atmosphere in the reaction chamber.

2. A method for preparing zinc oxide semiconductor material according to claim 1 including the step of preheating the zinc-containing organic compound.

3. A method for preparing zinc oxide semiconductor material according to claim 1 wherein the zinc-containing organic compound is a zinc acetylacetonate ($Zn(acac)_2$; wherein ac represents acetylacetone).

4. A method for preparing zinc oxide semiconductor material according to claim 3 wherein the hydrate of zinc acetylacetonate ($Zn(acac)_2$) is a monohydrate.

5. A method for preparing zinc oxide semiconductor material according to claim 1 wherein the lattice constant of the substrate is within ±20% of the lattice constant of the zinc oxide semiconductor material.

6. A method for preparing zinc oxide semiconductor material according to claim 1 wherein the substrate is a monocrystal material having a crystal surface allowing the crystal structure of the zinc oxide semiconductor material crystal formed on the substrate to a-axis orientation of the wurtzite structure.

7. A method for preparing zinc oxide semiconductor material according to claim 6 wherein the substrate is a monocrystal sapphire having a (01$\bar{1}$2) orientation as the forming surface for the zinc oxide semiconductor material.

8. A method for preparing a zinc oxide semiconductor material comprising introducing an organometallic compound containing zinc as a metal component into a reaction chamber and vaporizing a zinc-containing organic compound to effect a specific decomposition reaction on a substrate, thereby forming a zinc oxide semiconductor material on the substrate, which comprises using, as the zinc-containing organic compound, a monohydrate of zinc acetylacetonate (Zn(acac)$_2$).

9. A method for preparing zinc oxide semiconductor material according to claim 8 including the step of preheating the zinc-containing organic compound.

10. A method for preparing zinc oxide semiconductor material according to claim 8 wherein the lattice constant of the substrate is within ±20% of the lattice constant of the zinc oxide semiconductor material.

11. A method for preparing zinc oxide semiconductor material according to claim 8, wherein the substrate is a monocrystal material having a crystal surface allowing the crystal structure of the zinc oxide semiconductor material crystal formed on the substrate to a-axis orientation of the wurtzite structure.

12. A method for preparing zinc oxide semiconductor material according to claim 11 wherein the substrate is a monocrystal sapphire having a (01$\bar{1}$2) orientation as the forming surface for the zinc oxide semiconductor material.

* * * * *